Figure 1:
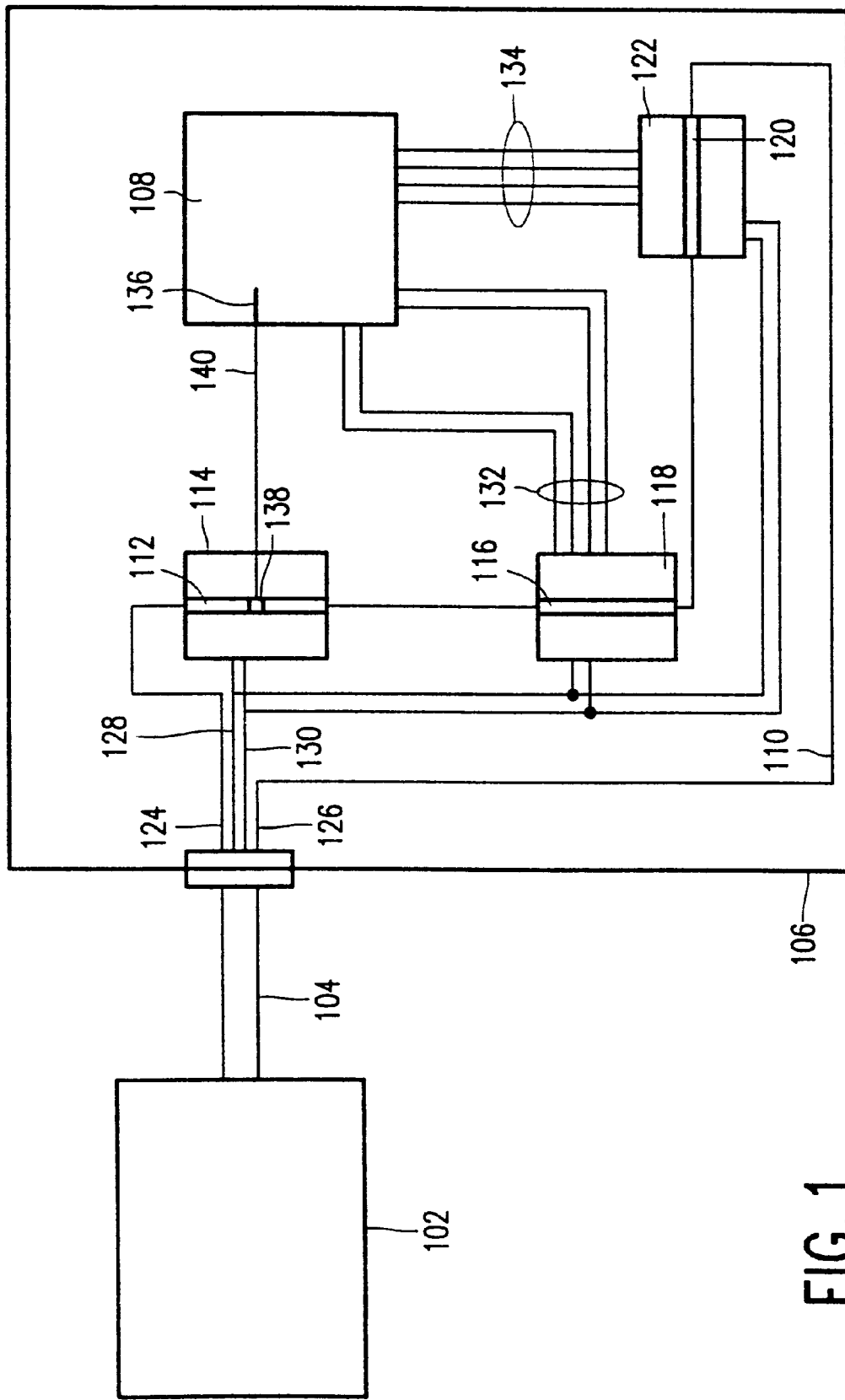

United States Patent
De Wit et al.

[19]

[11] Patent Number: 5,983,378
[45] Date of Patent: *Nov. 9, 1999

[54] METHOD TESTER AND CIRCUIT FOR APPLYING A PULSE TRIGGER TO A UNIT TO BE TRIGGERED

[75] Inventors: Hendrikus De Wit; Cornelis F. J. M. Stork, both of Eindhoven, Netherlands

[73] Assignee: JTAG Technologies, Eindhoven, Netherlands

[ * ] Notice: This patent issued on a continued prosecution application filed under 37 CFR 1.53(d), and is subject to the twenty year patent term provisions of 35 U.S.C. 154(a)(2).

[21] Appl. No.: 08/729,480

[22] Filed: Oct. 10, 1996

[30] Foreign Application Priority Data

Oct. 13, 1995 [EP] European Pat. Off. ............. 95202758

[51] Int. Cl.⁶ ............................................. G01R 31/28
[52] U.S. Cl. ........................................................ 714/727
[58] Field of Search ............................ 371/22.31, 22.32, 371/22.34, 22.5, 22.6, 25.1, 27.1, 27.5; 395/183.06; 324/765, 763; 714/30, 32, 37, 43, 48, 718, 720, 726, 727, 733, 734

[56] References Cited

U.S. PATENT DOCUMENTS

| | | | |
|---|---|---|---|
| 5,172,377 | 12/1992 | Robinson et al. | 371/22.3 |
| 5,428,626 | 6/1995 | Frisch et al. | 371/27 |
| 5,430,735 | 7/1995 | Sauerwald et al. | 371/22.3 |
| 5,444,715 | 8/1995 | Gruetzner et al. | 371/22.3 |
| 5,498,972 | 3/1996 | Haulin | 324/765 |
| 5,513,187 | 4/1996 | Zepp | 371/22.3 |
| 5,630,048 | 5/1997 | La Joie et al. | 395/183.01 |
| 5,633,812 | 5/1997 | Allen et al. | 364/578 |
| 5,644,261 | 7/1997 | Frisch et al. | 327/277 |
| 5,648,973 | 7/1997 | Mote, Jr. | 371/223 |

FOREIGN PATENT DOCUMENTS

| | | | |
|---|---|---|---|
| 0415614B1 | 6/1990 | European Pat. Off. | G06F 11/26 |
| 0402134A2 | 12/1990 | European Pat. Off. | G01R 31/28 |
| 0665498A2 | 8/1995 | European Pat. Off. | G06F 11/267 |
| 4306786 | 11/1982 | Japan . | |

OTHER PUBLICATIONS

"IEEE Standard Test Access Port and Boundary–Scan Architecture" IEEE STD 1149.1–1990; May 21, 1990.
"The ABCs of Boundary–Scan Test", Philips Test & Measurement, Eindhoven, The Netherlands, pp. 1–44.
"Boundary–Scan Test—A Practical Approach", Harry Bleeker, Peter Van Den Eijnden, Frans De Jong, pp. 156–166.

*Primary Examiner*—Robert W. Beausoliel, Jr.
*Assistant Examiner*—Nadeem Iqbal
*Attorney, Agent, or Firm*—Anne E. Barschall

[57] ABSTRACT

A unit (108) to be triggered, for example a memory, receives data under the control of Boundary Scan Test (BST) logic, via a BST chain (110). The invention utilizes a pulse circuit (202) which generates a pulse trigger for the unit (108) on the basis of a stimulus presented via the BST chain (110). This saves time, because it is no longer necessary to supply the entire pulse trigger via the BST chain and the supply of the stimulus now suffices.

14 Claims, 10 Drawing Sheets

METHOD TESTER AND CIRCUIT FOR APPLYING A PULSE TRIGGER TO A UNIT TO BE TRIGGERED

This invention relates to a method of applying a pulse trigger to a unit to be triggered, the pulse trigger being applied to the unit to be triggered under the control of Boundary Scan Test (BST) logic.

The invention also relates to a tester for applying a pulse trigger to a unit to be triggered under the control of Boundary Scan Test (BST) logic.

The invention also relates to an electronic circuit comprising a Boundary Scan Test (BST) chain.

A unit to be triggered is to be understood to mean herein a unit which executes an operation only after having received an appropriate signal, the so-called pulse trigger. A pulse trigger of this kind has a given dynamic behaviour. It may be, for example an edge at a transition from a given value to another given value, a pulse at which the signal changes its value and subsequently returns thereto again, or a pulse train involving various changes of the value. An example of a unit to be triggered is a memory which receives address information and data on appropriate pins and stores the data after the pulse trigger, being a write enable in the present case, has been applied to the relevant pin.

Boundary Scan Test (BST) is a method developed to assist the testing of Printed Circuit Boards and is laid down in a standard (IEEE Std. 1149.1—1990). The BST method is also described in U.S. Pat. No. 5,430,735 (PHN 11.856). The publication "The ABCs of Boundary Scan Test", published by Philips Test & Measurement, Eindhoven, the Netherlands, describes the concept of the method and contains examples of its implementation. A method of the kind set forth is described on pages 161 to 166 of the book "Boundary-Scan Test, Practical Approach" by Harry Bleeker, Peter van den Eijnden and Frans de Jong, Kluwer, 1993, ISBN 0-7923-9296-5. These pages describe how a memory is tested by driving it by the BST chain with BST cells. According to the known method the pulse trigger, in that case being a write enable (WE) for the memory, is applied to the memory via the BST chain. Table 5–12 on page 163 of the cited book reveals that 3 vectors are required to apply the pulse trigger to the memory, i.e. the lines 4–6 of the table. A vector is a pattern of bits, each of which is placed in an appropriate BST cell. To this end, a vector must be serially shifted through the BST chain. In this case 3 vectors are required, because the pulse trigger must consist of the bits "1", "0" and "1". A BST chain consists of a potentially large number of BST cells; in that case many shift operations are required to apply the pulse trigger to the memory. It is a drawback of the known method that the application of the pulse trigger is very time consuming.

It is inter alia an object of the invention to provide a method of the kind set forth in which the application of the pulse trigger is less time consuming than in the known method. To this end, the method in accordance with the invention is characterized in that in the BST logic a state is determined in which the pulse trigger can be generated, and that in response to said state a pulse circuit is activated by the BST logic in order to generate the pulse trigger. Because the pulse trigger is generated by the pulse circuit and no longer by the BST logic itself, the pulse trigger can be generated within a shorter period of time. The pulse circuit can independently generate the pulse trigger and need not do so in the form of cycles such as those in which the BST logic applies data to the unit.

A version of the method in accordance with the invention, in which the pulse rigger is applied to the unit to be triggered under the control of a BST chain, is characterized in that a stimulus is shifted to a predetermined first BST cell of the BST chain, said BST cell being coupled to a first input of a pulse circuit, that the stimulus is applied to the first input of the pulse circuit by the predetermined first BST cell, and that the pulse circuit generates the pulse trigger in response to the stimulus. The stimulus is placed in the BST cell coupled to the pulse circuit in one complete shift operation during which all necessary cells in the BST chain receive data. Subsequently, the stimulus is applied to the pulse circuit without further shift operations and the pulse trigger is generated. According to the method of the invention, the pulse circuit independently generates the pulse trigger which, therefore, is not supplied by the BST chain as in the known method. Time is thus saved.

A version of the method of the invention is characterized in that an enable signal is shifted to a predetermined second BST cell of the BST chain, which second BST cell is coupled to an enable input of the pulse circuit, that the enable signal is applied to the enable input of the pulse circuit by the predetermined second BST cell, and that the pulse circuit generates the pulse trigger in the presence of the enable signal and, in the absence of the enable signal, passes on the stimulus from the first input in a transparent mode as an alternative for the pulse trigger. The pulse circuit can be switched to a transparent mode by way of the enable input. In the transparent mode the circuit no longer generates the pulse trigger, but passes on the stimulus from the input to the output. The pulse circuit can thus be by-passed and the pulse trigger can be applied completely via the BST chain.

A tester in accordance with the invention is characterized in that, in addition to the BST logic, the tester comprises a pulse circuit, an input of which is coupled to the BST logic, that the BST logic is arranged to determine a state in which the pulse trigger can be generated, and that the pulse circuit is arranged to generate the pulse trigger in response to said state and under the control of the BST logic. The pulse circuit can independently generate the pulse trigger in a shorter period of time than the BST logic itself. The pulse circuit need not generate the pulse trigger in the form of cycles such as those in which the BST logic applies data to the unit.

An embodiment of the tester in accordance with the invention, intended to apply the pulse trigger to the unit to be triggered under the control of a Boundary Scan Test (BST) chain, is characterized in that the input of the pulse circuit is coupled to a predetermined first BST cell in the BST chain, and that the pulse circuit is arranged to generate the pulse trigger in response to a stimulus from the predetermined first BST cell. The pulse trigger to be generated on the basis of a stimulus from the relevant BST cell can be applied to the unit to be triggered by the tester via an appropriate connection. The tester in accordance with the invention enables a pulse trigger to be applied to the unit to be triggered by means of only one complete shift operation through the BST chain.

An electronic circuit in accordance with the invention is characterized in that the circuit comprises a pulse circuit, a fist input of which is coupled to a predetermined first BST cell in the BST chain, and that the pulse circuit is arranged to generate a pulse trigger in response to a stimulus from the predetermined first BST cell. Because the pulse circuit is arranged to generate the pulse trigger on the basis of a stimulus received via the BST chain, the electronic circuit in accordance with the invention does not require further shift operations through the BST chain in order to present the pulse trigger to the unit to be triggered. The electronic circuit in accordance with the invention can be realized as an assembly of components, for example on a Printed Circuit Board, with a BST chain. The pulse circuit can then be included in the assembly as an independent circuit. The electronic circuit in accordance with the invention can also be constructed as an independent component with a BST chain of BST cells, and with the pulse circuit. In addition to the pulse circuit, such a component may comprise a further electronic function. Furthermore, the electronic circuit in accordance with the invention may be constructed as a component containing a unit to be triggered, the BST chain and the pulse circuit.

Further attractive versions of the method, the tester and the electronic circuit in accordance with the invention are described in dependent claims.

These and other aspects of the invention will be apparent from and elucidated with reference to the embodiments described hereinafter.

Figure 2:
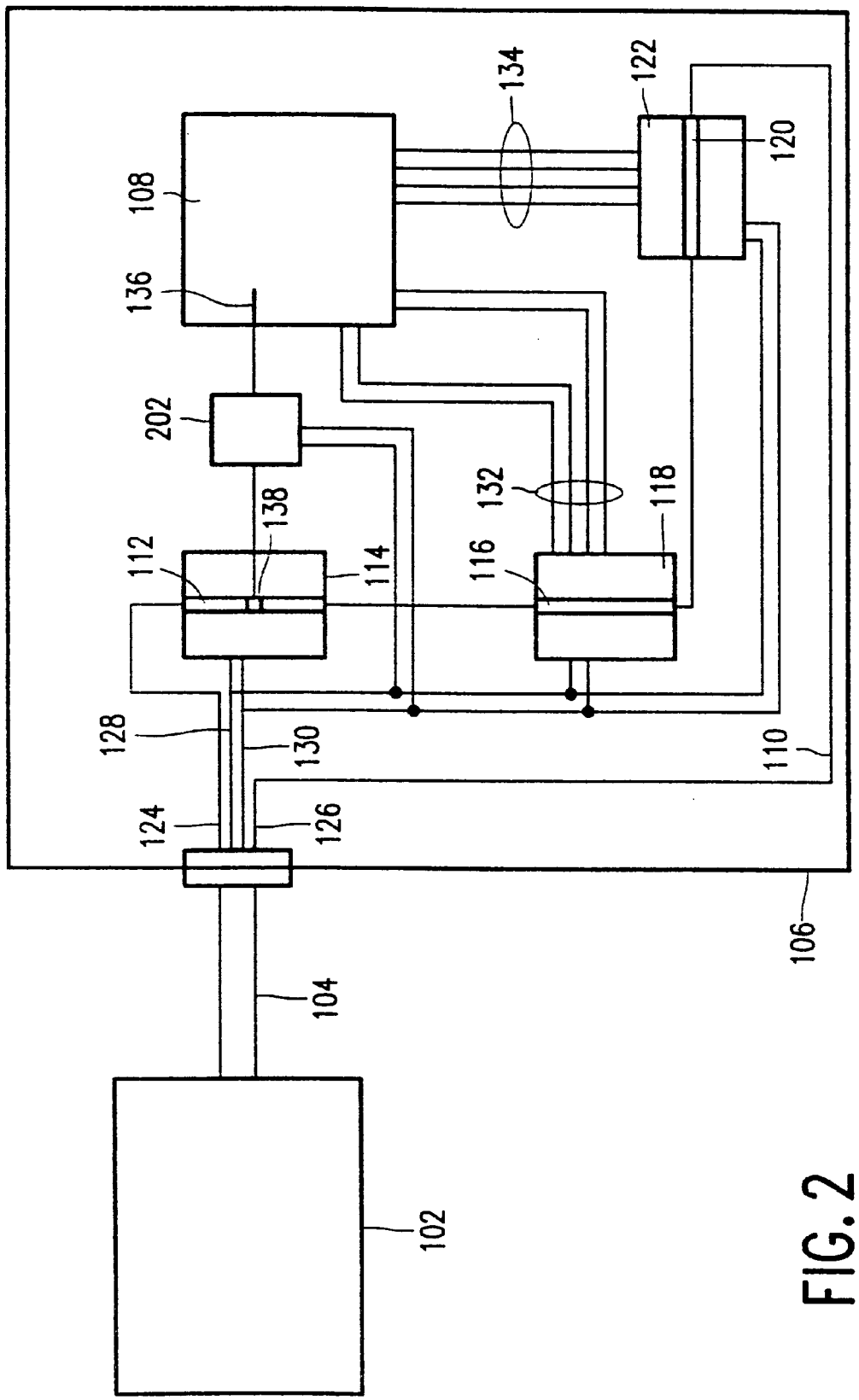
Figure 3:
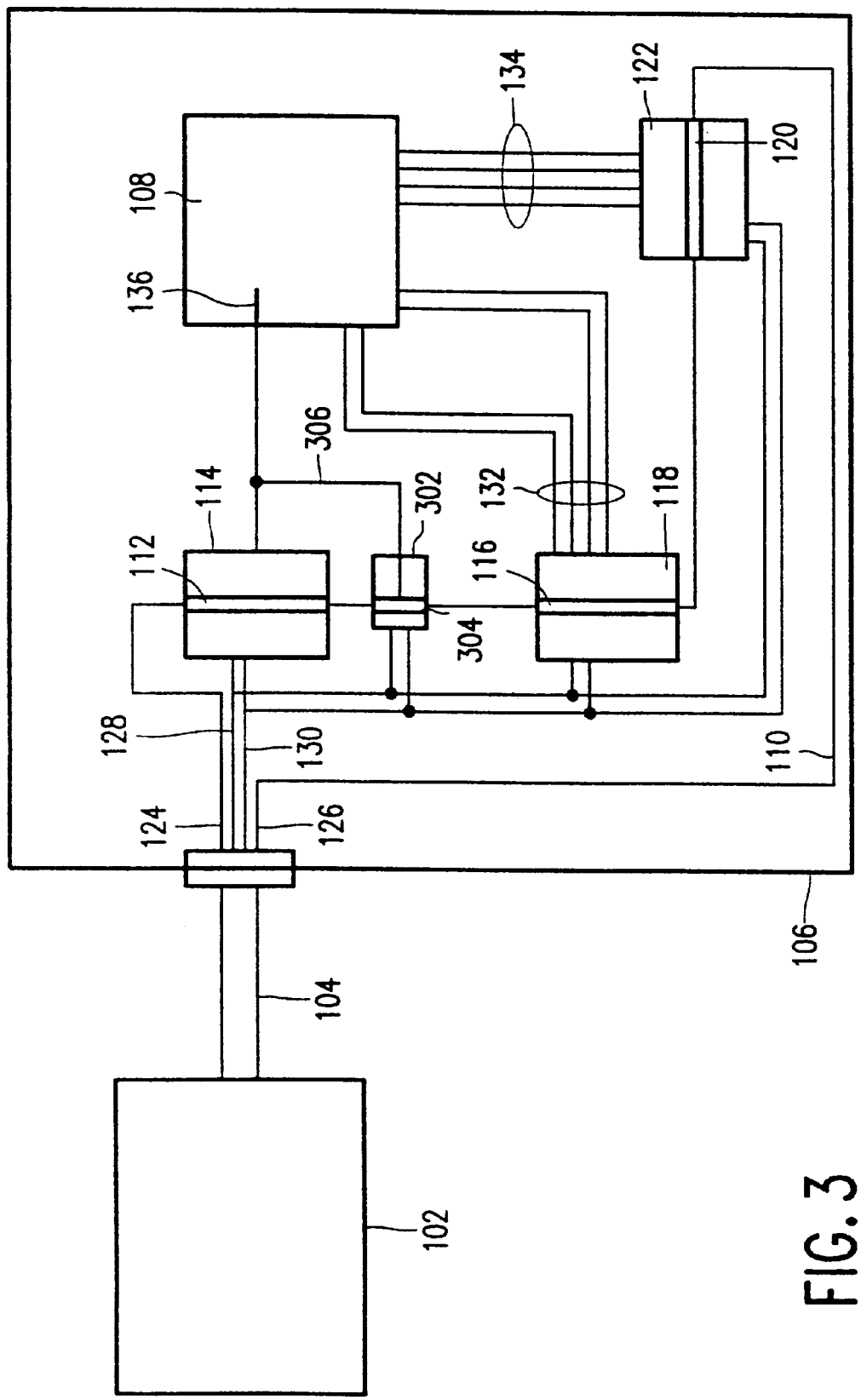
Figure 4:
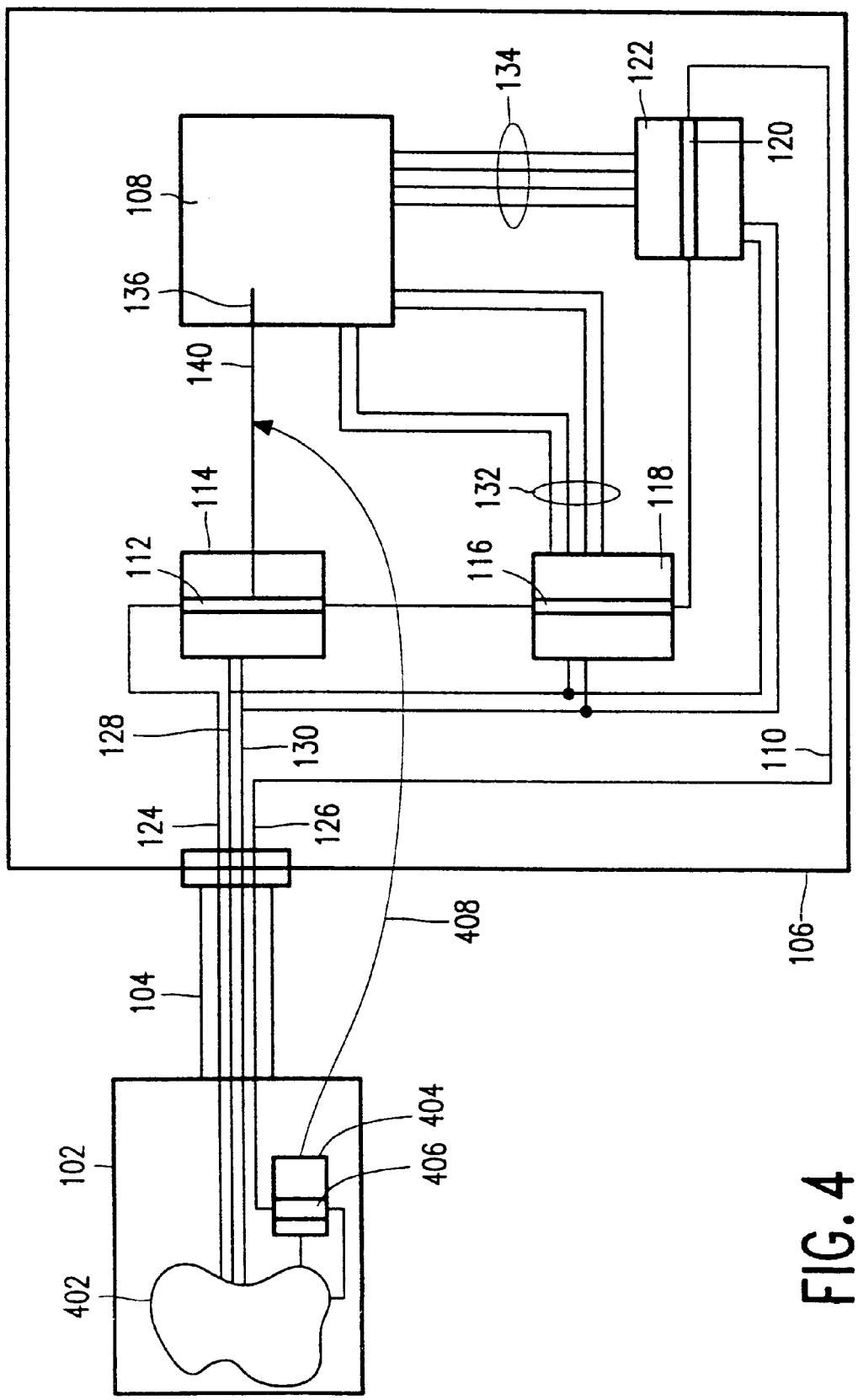
Figure 5:
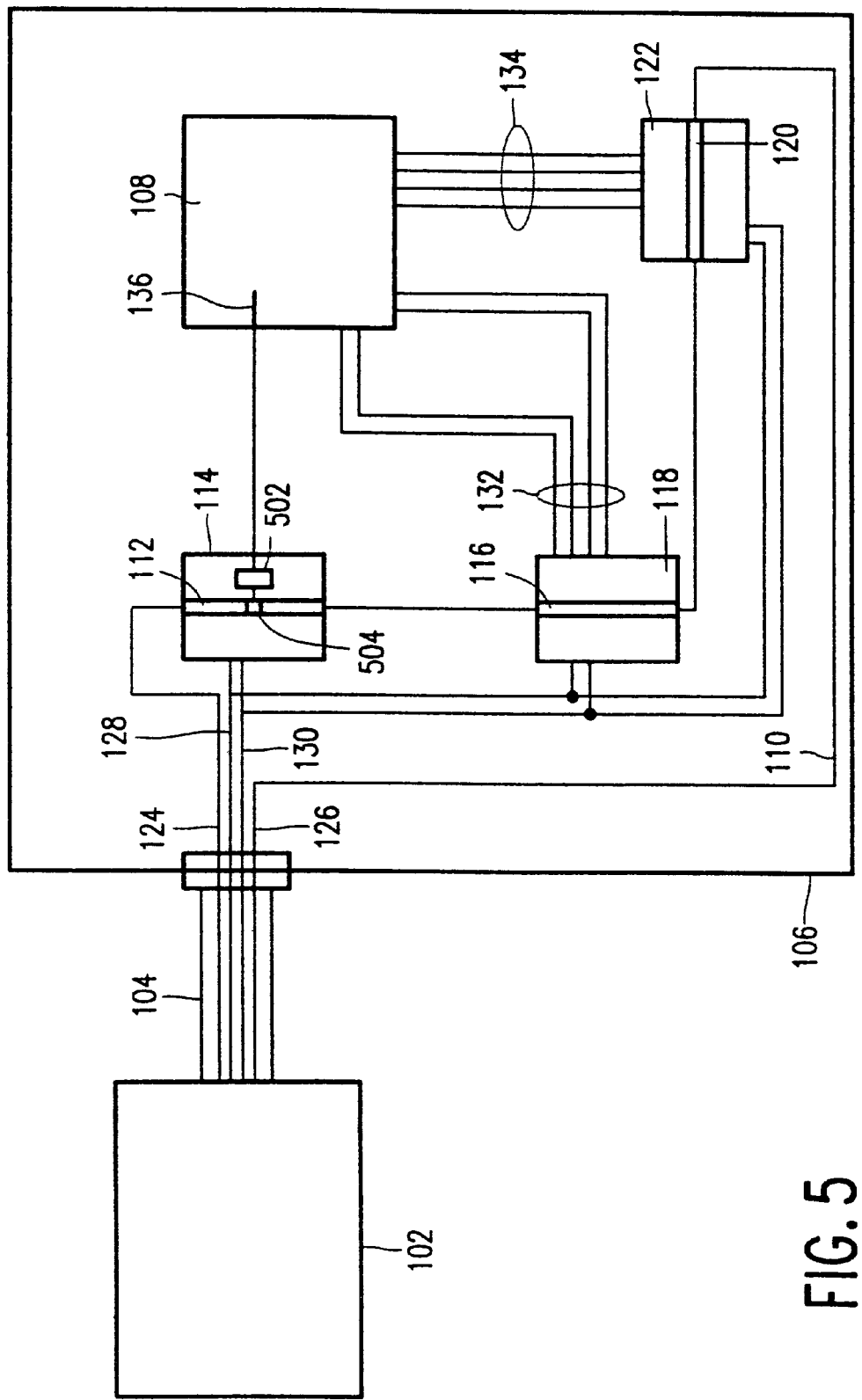
Figure 6:
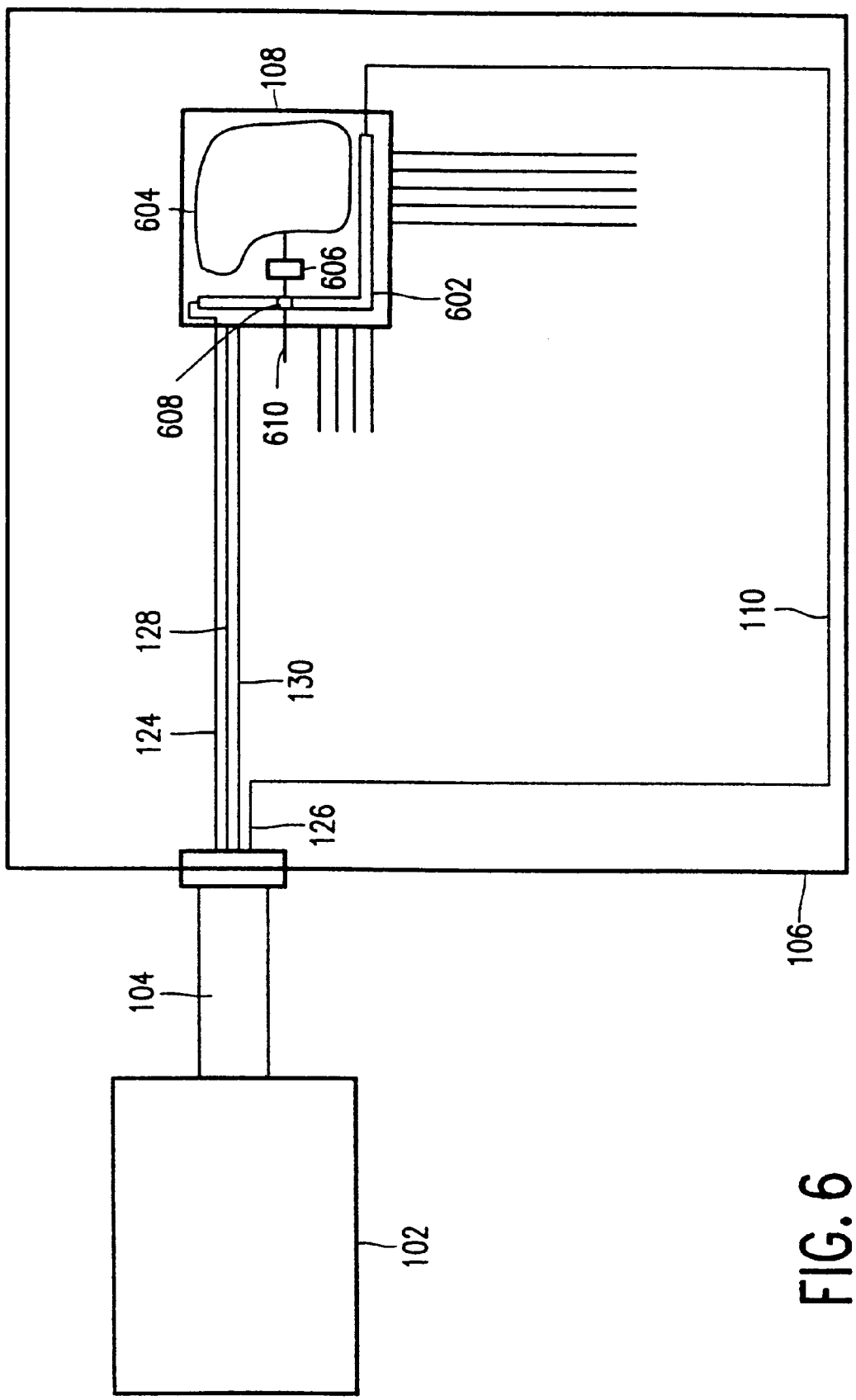
Figure 7:
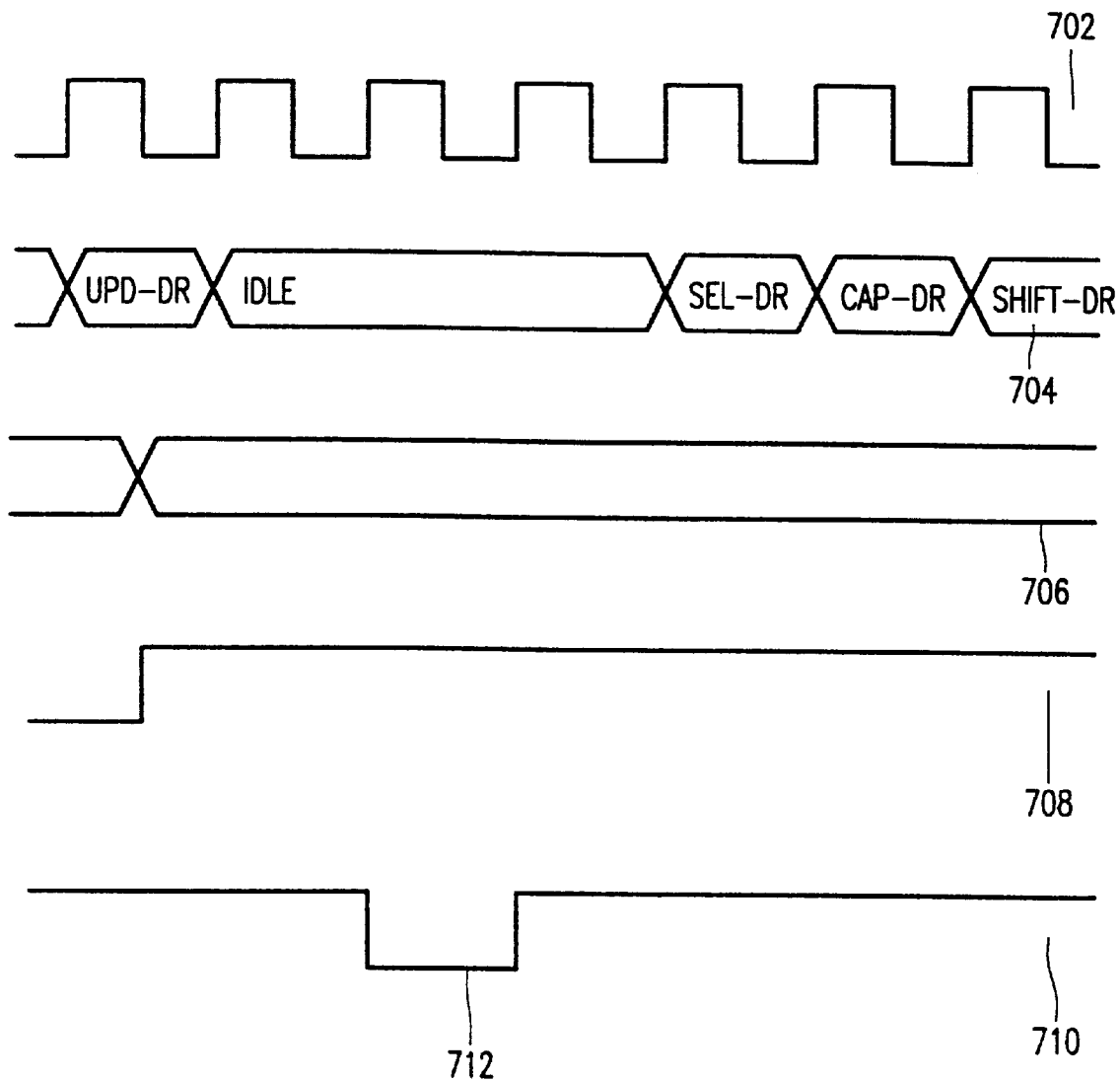
Figure 8:
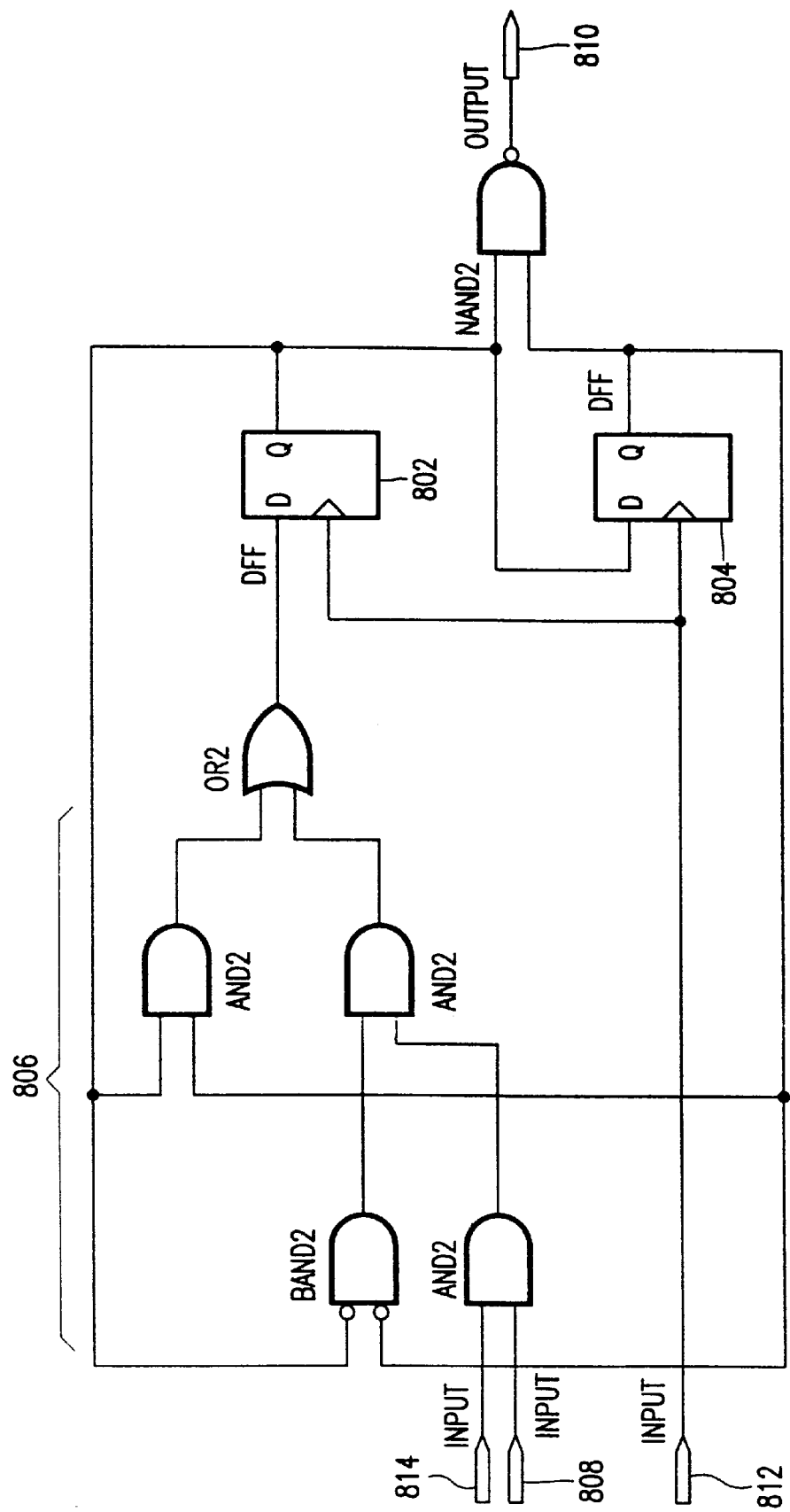
Figure 9:
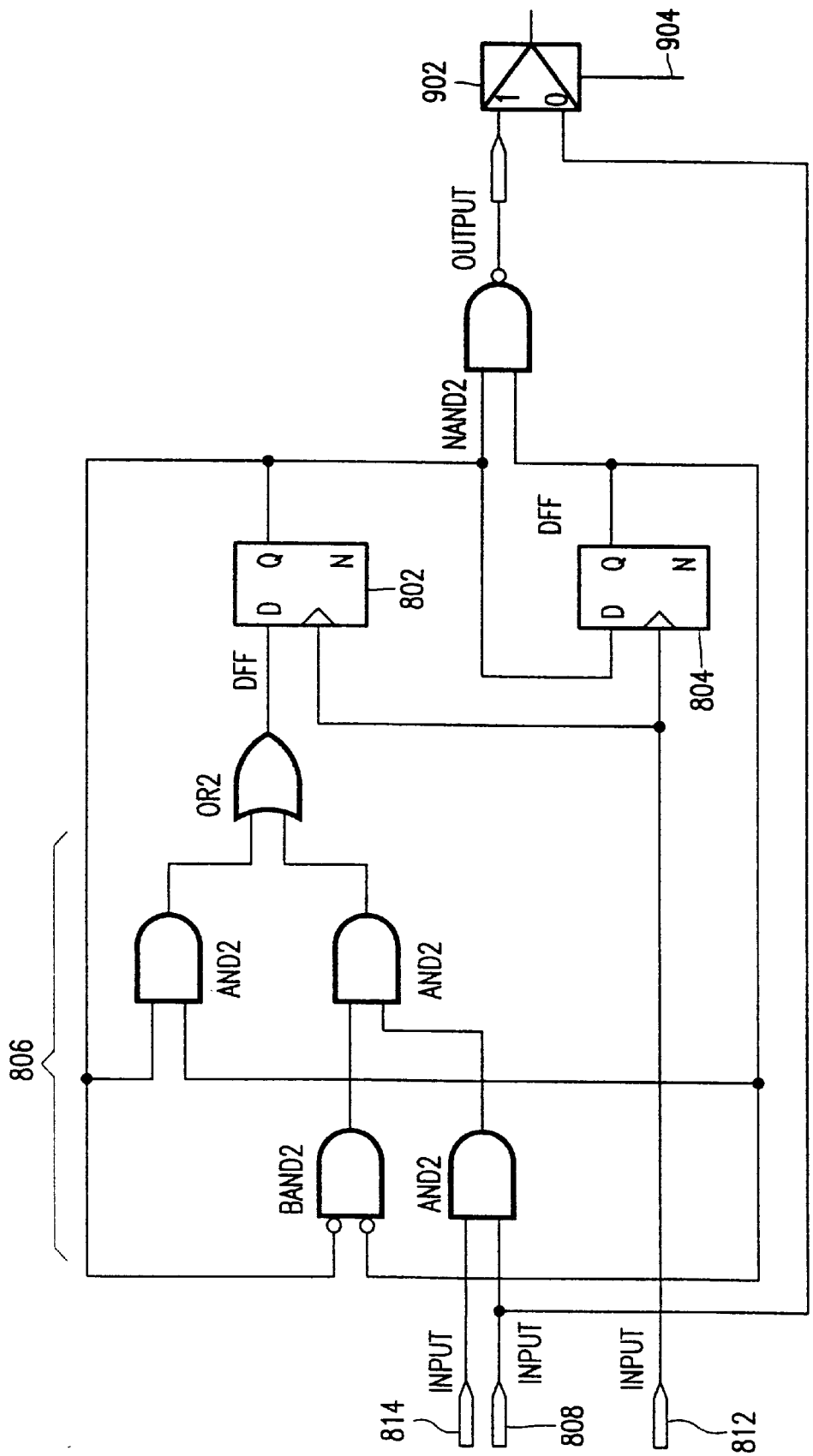
Figure 10:
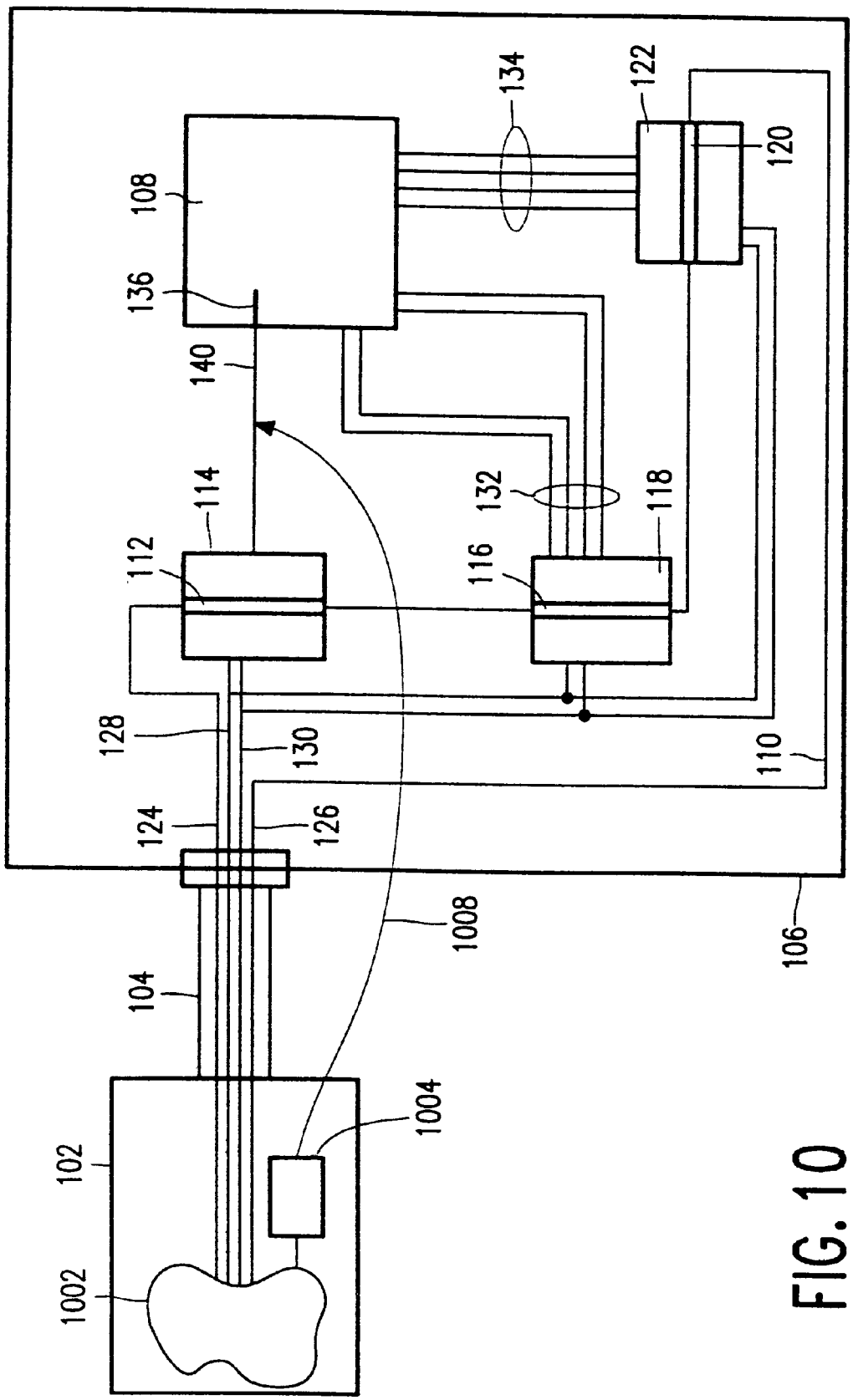

In the drawings:

FIG. 1 shows some components of an arrangement for carrying out the known method, FIG. 2 shows some components of an arrangement for carrying out the invention, FIG. 3 shows an alternative arrangement for carrying out the invention, FIG. 4 shows an alternative arrangement for carrying out the invention in which the pulse circuit is included in the tester, FIG. 5 shows an alternative arrangement for carrying out the invention in which the pulse circuit is included in a component having a further functionality, FIG. 6 shows an alternative arrangement for carrying out the invention in which the pulse circuit is included in the unit to be triggered, FIG. 7 shows a number of signals relating to the pulse circuit upon use of a version of the method in accordance with the invention, FIG. 8 shows an embodiment of the pulse circuit which is suitable for carrying out the method in accordance with the invention, FIG. 9 shows an embodiment of the pulse circuit which comprises an enable input, and FIG. 10 shows an alternative embodiment of the tester comprising the pulse circuit.

Corresponding reference numerals in the drawing denote identical or similar components.

FIG. 1 shows some components of an arrangement for carrying out the known method. Tester 102 is connected, via a connection 104, to an assembly 106, for example a Printed Circuit Board on which a unit 108 to be triggered is accommodated. The assembly 106 also comprises a Boundary Scan Test (BST) chain 110 which comprises a BST register 112 of a component 114, a BST register 116 of a component 118, and a BST register 120 of a component 122. The connection point 124 to the tester is the so-called Test Data Input (TDI) and the connection point 126 is the Test Data Output (TDO). Furthermore, each component receives a Test Clock (TCK) sign via a point 128 and a Test Mode Select (TMS) signal via a point 130, both signals being supplied by the tester 102. A BST register of a component comprises a number of BST cells, each of which is coupled to a respective pin of the component. This coupling has been omitted in FIG. 1 for the sake of clarity. The components 114, 118 and 120 and the unit 108 to be triggered also have a given functionality. However, in the context of the present invention this functionality is not relevant so that it is omitted for the sake of clarity of FIG. 1. The significance of the BST signals and the function of the BST components are described in the cited publication "The ABCs of Boundary Scan Test". The tester shifts signals through the BST chain so as to reach given BST cells, after which these signals are presented, via connections 132 and 134, to the unit 108 to be triggered. However, in order to process these signals the unit 108 should receive a pulse trigger on input 136. An example in this respect is that the unit 108 concerns a memory which should receive a Write Enable signal in order to accept data presented, or that the unit 108 is a memory which should receive an Output Enable signal in order to output data present at a given address in the memory. There are also other examples of the use of such a pulse trigger for explicitly starting an operation in a unit to be triggered. The pulse trigger for the input 136 comprises a number of successive bits which are shifted, via the BST chain, to the BST cell 138 wherefrom they are presented to the input via each time the connection 140. For given memories a "1", a "0" and a "1" should be successively applied to the input 136 for a write operation in the memory; in that case three complete shift operations through the BST chain are required. The signal must be shifted through all BST cells in a BST chain, thus requiring a corresponding number of cycles of the tester. When this approach is used in practice, test periods as long as 3 minutes occur in the testing of memories.

FIG. 2 shows some components of an arrangement for carrying out the invention. In this arrangement a pulse circuit 202 is inserted in the connection between the component 114 and the input 136 of the unit 108. The pulse circuit is arranged to generate independently the pulse trigger required for the unit 108. The pulse circuit can be constructed in various ways, for example as a so-called one-shot circuit, as a single flip-flop, or as a state machine. In the embodiment shown in FIG. 2, the pulse circuit is coupled to the BST cell 138 and receives a stimulus for generating the pulse trigger from said BST cell. The pulse circuit also receives the BST signals TMS and TCK so that it can output the pulse trigger in association with the other data presented to the unit 108 via the BST chain. The pulse circuit starts after a so-called update of the BST register and operates in synchronism with the TCK signal. To this end, the pulse circuit comprises own BST logic with an own TAP controller; for a further description, reference is made to the cited publication "The ABCs of Boundary Scan Test". In the method of the invention the data for the unit 108 and the stimulus for the pulse circuit are shifted to the relevant BST cells via the BST chain. Subsequently, the data is presented to the unit 108 and the stimulus is applied from the BST cell 138 to the pulse circuit. Subsequently, the pulse circuit generates the pulse trigger for the input 136 of the unit 108 without further shift operations of the BST chain. In the above example, where the pulse trigger consists of the bits "1", "0" and "1", two complete shift operations can be dispensed with in accessing the memory. In the described practical example the invention reduces the test period of the memory from 3 to 1 minutes.

FIG. 3 shows an alternative arrangement for carrying out the invention. Therein, the pulse circuit 302 is included in the BST chain as an independent component provided with BST logic. The pulse circuit comprises its own BST cell 304 and its own TAP controller and is coupled, via the connection 306, to the input 136 of the unit 108 to be triggered. In this embodiment of the invention the data for the unit 108 and the stimulus for the pulse circuit are again shifted to the relevant BST cells via the BST chain. The data is then presented to the unit 108 and the stimulus is applied from the BST cell 304 to the logic of the pulse circuit. The pulse circuit subsequently generates the pulse trigger for the input 136 of the unit 108 without further shift operations in the BST chain. When the pulse trigger is applied in this manner, the output of the component 114 which presents the pulse trigger in the operational mode is de-activated so as to prevent competition on the relevant connection. To this end, said output is constructed as a tri-state output which can be switched to the high-impedance (high Z) mode so that another output can determine the value of the connection. A facility of this kind is described in the Boundary Scan Test standard. The component 302 can be designed once, after which it can be used as a standard component in many applications.

FIG. 4 shows an alternative arrangement for carrying out the invention, in which the pulse circuit is included in the tester. In this embodiment the tester 102 comprises, in addition to the core logic 402, a pulse circuit 404 which is included in the BST chain. The pulse circuit comprises a BST cell 406. In the operational mode the input 136 of the unit 108 receives the pulse trigger from the component 114 via the connection 140. When the data is supplied via the BST chain, for example in order to execute a test, the pulse trigger can be supplied by the pulse circuit 404 via the connection 408. The connection 408 may be implemented as a detachable connection cord which can be brought into contact with the connection 140 by way of a pen. However, the connection 408 may also be designed so as to form part of the connection 104 between the tester 102 and the assembly 106. The method is carried out as described above, the stimulus being shifted into the BST cell 406 and the actual pulse circuit subsequently generating the required pulse trigger which is applied to the input 136 via the connection 408. The circuit 114, supplying the original pulse trigger, will then be switched off in the manner described with reference to FIG. 3. An advantage of the embodiment of FIG. 4 resides in the fact that it can be used in an assembly 106, for example a printed circuit board comprising several components, which was initially not conceived to generate the pulse trigger according to the method of the invention. When a further external connection 408 is provided, the pulse trigger can be generated, under the control of an appropriately designed tester 102, in the described manner in conformity with the invention. The assembly 106 itself need not be modified or provided with a further facility.

FIG. 5 shows an alterative arrangement for carrying out the invention, in which the pulse circuit is included in a component having a further functionality. The component 114 comprises a pulse circuit 502 and an associated BST cell 504, in addition to a further functionality which is not shown. The pulse circuit 502 is controlled by the TAP controller of the component 114 and does not require its own TAP controller. In this embodiment the stimulus is shifted to the BST cell 504, after which it is presented to the pulse circuit 502. The pulse circuit subsequently generates the pulse trigger without a further shift operation being required. This embodiment is particularly suitable in situations in which a special component 114, i.e. a so-called ASIC (Application Specific Integrated Circuit) must be designed for the assembly 106. In that case it is comparatively simple and inexpensive to include the pulse circuit in said ASIC.

FIG. 6 shows an alternative arrangement for carrying out the invention, in which the pulse circuit is included in the unit to be triggered. The unit 108 to be triggered comprises a BST register 602 with BST cells and also comprises a core 604 with the actual functionality. Together with other components (not shown) the BST register 602 is included in the BST chain of the assembly 106. The unit 109 comprises the further BST logic, such as a TAP controller, and can thus be set to a BST mode by the tester. The unit 108 also comprises a pulse circuit 606 which is capable of generating the pulse trigger when the unit 108 operates in a BST mode and the data is supplied via the BST chain. The BST cell 608 of the BST register 602 receives the stimulus via BST chain and subsequently presents it to the pulse circuit 606. In response thereto the pulse circuit generates the pulse trigger for the core 604 without a further shift operation through the BST chain being required. In the operational mode of the unit 108 the pulse circuit is de-activated and the pulse trigger is generated by another component (not shown) of the assembly and presented to the unit 108 via the connection 610. The embodiment shown in FIG. 6 is particularly suitable for use if the unit 108 to be triggered itself comprises the necessary BST logic. The pulse circuit can then utilize the TAP controller already present, so that it occupies comparatively little space in the unit 108.

In the embodiments of the invention shown in the FIGS. 2 to 6 the unit 108 to be triggered is included in the assembly 106. However, the invention can also be used in cases where the unit is provided outside the assembly and is coupled thereto via an appropriate connection.

FIG. 7 shows a number of signals relating to the pulse circuit as they occur during execution of a version of the method in accordance with the invention. Signal 702 is the TCK signal of the BST logic and determines inter alia the instants at which the value of other signals may change. The reference 704 denotes a number of states of the TAP controller. The reference 706 indicates when the signals applied from the BST cells to the unit to be triggered are valid in time. The stimulus presented to the pulse circuit is denoted by the reference 708. The pulse trigger generated by the pulse circuit is represented by the line 710. The signals shown concern a pulse circuit which cooperates with the further BST logic which applies data to the unit to be triggered. This is only one of the feasible embodiments and, evidently, a different version will involve other signals. The pulse trigger shown is a so-called negative pulse trigger, because the actual pulse 712 is negative with respect to the remainder of the signal. It will be evident that the invention can also be used in the event of a positive pulse trigger. The signal is then inverted with respect to the signal 710 and the actual pulse is positive in comparison with the remainder of the signal. The invention can also be used in a pulse trigger of different form. This is the case, for example, in a situation in which it suffices that the input to be triggered receives a single transition from low to high or a single transition from high to low. However, the invention can also be used in situations in which the pulse trigger is a longer, more complex signal. The savings realized by carrying out the invention arises from the fact that the complete pulse trigger need no longer be transported to the input to be triggered via the BST chain, but that it suffices to apply a stimulus to a pulse circuit which subsequently generates the complete pulse trigger independently and without further shift operations being required.

In conformity with the method shown in FIG. 7, the state "UPDATE-DR" of the TAP controller serves as a start in the pulse circuit. However, another state could also be chosen, be it that the timing of said other state would differ from the timing shown.

FIG. 8 shows an embodiment of the pulse circuit which is suitable for carrying out the method of the invention. This is a state machine comprising a flip-flop 802, a flip-flop 804 and combinatory logic 806. The circuit comprises an input 808 for receiving the stimulus and an output 810 for supplying the pulse trigger. The pulse circuit also comprises an input 812 for receiving the TCK signal, being the clock signal controlling the activities of the BST logic, and an input 814 for receiving the update signal, being the signal supplied by the TAP controller which indicates the updating of the BST registers. The TCK signal and the update signal together enable the pulse circuit to operate in combination with the other BST logic; for a further explanation in this respect reference is made to the cited publication "The ABCs of Boundary Scan Test". Under the control of the TCK signal, the outputs of the flip-flops, and hence the output of the pulse circuit, receive a repetition of values in conformity with the following table.

| Q (802) | Q (804) | Q (810) |
|---------|---------|---------|
| 0 | 0 | 1 |
| 0 | 1 | 1 |
| 1 | 1 | 0 |
| 1 | 0 | 1 |

The series "1101" on the output 810 corresponds to the pulse trigger 710 in FIG. 7.

The pulse circuit of FIG. 8 can be included in a circuit which already comprises a TAP controller capable of supplying the update signal required. If the pulse circuit is constructed as a fully independent circuit, it should be provided with a TAP controller. Examples of such a fully independent circuit are specifically designed circuit on a printed circuit board (202 in FIG. 2) and a component comprising the pulse circuit (302 in FIG. 3).

FIG. 8 shows an embodiment of a pulse circuit which can be used in accordance with the invention. However, a circuit of this kind can be constructed in various ways, the circuit then being capable of cooperating more or less with the BST logic. The pulse circuit can be constructed in such a manner that the BST signals TMS and TCK are not used in the circuit, for example as in a one-shot circuit. The invention is not restricted to a given embodiment of the pulse circuit and circuits other than the circuit shown in FIG. 8 can be used in conformity with the invention.

FIG. 9 shows an embodiment of the pulse circuit which comprises an enable input. This embodiment of the pulse circuit comprises a multiplexer 902 which is controlled by an enable signal on input 904. This embodiment of the pulse circuit can be switched to a transparent mode under the control of the enable signal. The multiplexer 902 is then switched so that no longer the output of the actual pulse circuit is applied to its output but the signal from the input 808. The enable signal can be supplied by a BST cell, so that the pulse circuit can be driven to a transparent mode via the BST chain. Thus, in this embodiment it is possible to de-activate the pulse circuit and to apply the pulse trigger from the tester completely via the BST chain.

In the context of the present invention the described tester is used inter alia for ting the unit 108. The unit 108 may be a memory in which, as part of the test, data is written and subsequently read again, after which the data read is compared with the original data. A complete test comprises a large number of such read/write test steps so that it is comparatively time consuming. A so-called Output Enable signal is required so as to read from a memory. This signal is comparable with the Write Enable which can be supplied as a pulse trigger by the pulse circuit in accordance with the invention. Therefore, the invention can be readily used for the Output Enable signal for memories. In a given embodiment of the invention the pulse trigger for writing into the memory and the pulse trigger for reading from the memory are generated by the same pulse circuit. The pulse circuit generates the second pulse trigger in dependence on the first pulse trigger and does not require a separate stimulus for this purpose. Because it is not necessary to supply a separate stimulus via the BST chain, in this embodiment of the invention again a complete shift operation through the BST chain is saved during said write/read test step.

In addition to testing, however, the tester can also be used for programming a memory. In that case the program is written into the memory as data from the tester, via the BST chain. This is used inter alia for so-called flash memories.

A pulse circuit operating in cooperation with the further BST logic can be activated by various BST instructions. This may be one of the instructions "SAMPLE/PRELOAD" or "EXTEST" specified in the EST standard. However, it may also be activated by a private instruction added to the component. The BST standard allows a manufacturer of a component to provide, in addition to the set of specified instructions, a supplementary instruction having a given function.

FIG. 10 shows an alternative embodiment of the tester comprising the pulse circuit. In addition to the core logic 1002 this embodiment of the tester 102 comprises a pulse circuit 1004. The pulse circuit is driven by the logic 1002 which generates the BST control signals, such as the TMS and TCK signals, for the assembly 106. In the operational mode the input 136 of the unit 108 receives the pulse trigger from the component 114 via the connection 140. When the data is supplied via the BST chain, for example in order to execute a test, the pulse trigger can be supplied by the pulse circuit 1004 via the connection 1008. The connection 1008 may be constructed as a detachable connection cord which is brought into contact with the connection 140 via a pen. However, the connection 1008 may also be constructed as part of the connection 104 between the tester 102 and the assembly 106. The method is carried out as described above, the pulse circuit generating, activated by the tester logic 1002, the required pulse trigger and applying it to the input 136 via the connection 1008. Activation can take place on the basis of a given instruction or command in the tester or on the basis of information in the memory of the tester. The memory controls the operation of the BST logic on the assembly 106 and, therefore, the pulse trigger can be given in relation to the operation of the components of the assembly. For example, first the data can be applied to the unit 108 via the connections 132 and 134, and subsequently the pulse trigger can be applied to the input 136. The circuit 114 which originally supplied the pulse trigger will be de-activated in the manner described with reference to FIG. 3. An advantage of the embodiment shown in FIG. 10 consists in that it can be used in an assembly 106, for example a printed circuit board comprising several components, which initially was not conceived to generate the pulse trigger in the manner of the invention. The pulse trigger can be generated by the described method of the invention by providing a further external connection 1008 and under the control of a tester 102 conceived for this purpose. The assembly 106 itself need not be modified or provided with a further facility.

We claim:

1. A method of applying a trigger pulse to a unit to be triggered, the method comprising:

a. in a tester device packaged separately from the unit, determining a state in boundary scan test logic, in response to which state the trigger pulse should be generated;

b. in the tester device, activating a pulse circuit by the boundary scan test logic, in response to said state;

c. in the tester device, generating the trigger pulse by the pulse circuit, in response to said activating, and d. applying the trigger pulse to the unit from the tester device.

2. The method of claim 1 wherein said determining comprises:

i. shifting a stimulus to a predetermined first boundary scan test cell of a boundary scan test chain, said predetermined first boundary scan test cell being coupled to a first input of said pulse circuit;

ii. applying said stimulus to a first input of the pulse circuit by the predetermined first boundary scan test cell;

iii. shifting an enable signal to a predetermined second boundary scan test cell of the boundary scan test chain, which second boundary scan test cell is coupled to an enable input of the pulse circuit; and iv. applying an enable signal to the enable input by the predetermined second boundary scan test cell;

wherein, in the presence of the enable signal, the activating step is performed in response to the applying said stimulus; and in the absence of the enable signal the stimulus from the first input is passed on in a transparent mode as an alternative for the trigger pulse.

3. A tester for applying a trigger pulse to a unit to be triggered, the test being packaged separately from the unit, the tester comprising:

a. boundary scan test logic, arranged to determine a state in which the trigger pulse should be generated; and b. a pulse circuit, having an input coupled to the boundary scan test logic, being arranged to generate the trigger pulse in response to the state and under the control of the boundary scan test logic, c. means for supplying the pulse trigger outside a packaging of the tester to the unit.

4. The tester of claim 1, wherein the input of the pulse circuit is coupled to a predetermined first boundary scan test cell in the boundary scan test chain; and the pulse circuit is arranged to generate the trigger pulse in response to a stimulus from the predetermined first boundary scan test cell.

5. The method of claim 3 further comprising producing a second trigger pulse in the pulse circuit responsive to the trigger pulse, the second trigger pulse having a different function from the trigger pulse.

6. The tester of claim 3 wherein the pulse circuit is arranged to generate a second trigger pulse in response to the first trigger pulse, the second trigger pulse having a different function from the trigger pulse.

7. Electrical apparatus arranged for boundary scan testing comprising:

boundary scan logic;

at least one first component directly coupled to the boundary scan logic, such direct coupling being for the purpose of providing test data or removing test data from the first component;

at least one second component not directly coupled to the boundary scan logic, said at least one second component requiring a trigger signal for operation, the trigger signal being expected to come from the first component during normal operation; and a trigger circuit directly coupled to the boundary scan logic for, during test operation, receiving state information therefrom and for generating the trigger signal in response to the state information.

8. The apparatus of claim 7 wherein the trigger circuit is disposed within the at least one first component.

9. The apparatus of claim 7 wherein the trigger circuit is disposed within the at least one second component.

10. The apparatus of claim 7 wherein the trigger circuit is arranged to generate the trigger signal in response to a stimulus in a first predetermined BST cell.

11. The apparatus of claim 10 wherein the trigger circuit is arranged to generate the trigger signal in response to both the stimulus in the first predetermined BST cell and an enable signal in a second predetermined BST cell.

12. The apparatus of claim 7, wherein the pulse circuit is arranged to produce a second trigger pulse in response to the trigger pulse, the second trigger pulse having a different function from the first trigger pulse.

13. The apparatus of claim 7 wherein the second component is not directly coupled to the boundary scan logic.

14. The tester of claim 9 wherein the second component is not directly coupled to the boundary scan logic.

* * * * *